US011820303B2

(12) United States Patent
Dunn et al.

(10) Patent No.: US 11,820,303 B2
(45) Date of Patent: Nov. 21, 2023

(54) SOLAR POWERED VEHICLE TOPPER UNIT

(71) Applicant: Manufacturing Resources International, Inc., Alpharetta, GA (US)

(72) Inventors: William Dunn, Alpharetta, GA (US); Jack Bartholmae, Duluth, GA (US); Douglas Bennett, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 399 days.

(21) Appl. No.: 17/001,942

(22) Filed: Aug. 25, 2020

(65) Prior Publication Data

US 2021/0061198 A1     Mar. 4, 2021

Related U.S. Application Data

(60) Provisional application No. 62/911,806, filed on Oct. 7, 2019, provisional application No. 62/892,104, filed on Aug. 27, 2019.

(51) Int. Cl.
*B60R 16/033* (2006.01)
*B60K 6/24* (2007.10)
(Continued)

(52) U.S. Cl.
CPC ............. *B60R 16/033* (2013.01); *B60K 6/24* (2013.01); *B60K 6/26* (2013.01); *B60K 6/28* (2013.01);
(Continued)

(58) Field of Classification Search
CPC ..... B60R 16/033; B60R 9/04; B60R 11/0229; B60R 11/0235; B60R 13/00; B60R 16/03;
(Continued)

(56) References Cited

U.S. PATENT DOCUMENTS 3,525,461 A   8/1970 Bronson
3,978,599 A   9/1976 Berger
(Continued)

FOREIGN PATENT DOCUMENTS

AU   201815719   10/2018
AU   201815720   10/2018
(Continued)

OTHER PUBLICATIONS

AdNation, Miller photos, May 9, 2017, 28 pages.
(Continued)

*Primary Examiner* — Rexford N Barnie
*Assistant Examiner* — Swarna N Chowdhuri
(74) *Attorney, Agent, or Firm* — STANDLEY LAW GROUP LLP; Jeffrey S. Standley; Adam J. Smith (57) ABSTRACT

A solar powered VTU and systems and methods for the same are provided. A solar energy harvesting device and an energy storage device are electrically connected to an electronic display within a housing. A support extends between the housing and the solar energy harvesting device such that a bottom surface of the solar energy harvesting device is elevated directly above, and is spaced apart from, a top surface of the housing. The solar energy harvesting device has a first footprint, and the housing has a second footprint. The first footprint is larger than, and directly overlies, the second footprint.

18 Claims, 9 Drawing Sheets

(51) Int. Cl.

| | | |
|---|---|---|
| *H02J 7/35* | (2006.01) | |
| *H05K 5/00* | (2006.01) | |
| *H05K 7/20* | (2006.01) | |
| *B60R 13/00* | (2006.01) | |
| *H02J 7/00* | (2006.01) | |
| *H02S 10/40* | (2014.01) | |
| *H02S 30/10* | (2014.01) | |
| *H02S 40/38* | (2014.01) | |
| *B60L 58/10* | (2019.01) | |
| *B60K 6/26* | (2007.10) | |
| *B60K 6/28* | (2007.10) | |
| *B60R 9/04* | (2006.01) | |
| *B60R 11/02* | (2006.01) | |
| *G09F 9/33* | (2006.01) | |
| *G09F 21/04* | (2006.01) | |
| *H02S 20/10* | (2014.01) | |
| *E04H 1/12* | (2006.01) | |
| *H02J 3/38* | (2006.01) | |
| *H02S 40/42* | (2014.01) | |
| *B60R 16/03* | (2006.01) | |
| *G09F 9/35* | (2006.01) | |
| *B60R 11/00* | (2006.01) | |

(52) U.S. Cl.
CPC ............... *B60L 58/10* (2019.02); *B60R 9/04* (2013.01); *B60R 11/0229* (2013.01); *B60R 11/0235* (2013.01); *B60R 13/00* (2013.01); *B60R 16/03* (2013.01); *E04H 1/1211* (2013.01); *G09F 9/33* (2013.01); *G09F 21/04* (2013.01); *G09F 21/042* (2020.05); *H02J 3/381* (2013.01); *H02J 7/0068* (2013.01); *H02J 7/35* (2013.01); *H02S 10/40* (2014.12); *H02S 20/10* (2014.12); *H02S 30/10* (2014.12); *H02S 40/38* (2014.12); *H02S 40/425* (2014.12); *H05K 5/0017* (2013.01); *H05K 7/202* (2013.01); *H05K 7/20172* (2013.01); *H05K 7/20954* (2013.01); *H05K 7/20972* (2013.01); *B60R 2011/004* (2013.01); *B60Y 2300/91* (2013.01); *B60Y 2400/112* (2013.01); *B60Y 2400/43* (2013.01); *B60Y 2400/60* (2013.01); *G09F 9/35* (2013.01); *H02J 2300/24* (2020.01)

(58) Field of Classification Search
CPC .... B60K 6/24; B60K 6/26; B60K 6/28; B60L 58/10; G09F 19/22; G09F 21/04; G09F 21/042; H02S 10/40; H02J 7/35
USPC .............................................. 307/9.1; 345/2.3
See application file for complete search history.

(56) References Cited

U.S. PATENT DOCUMENTS

| | | | |
|---|---|---|---|
| 4,052,806 A | 10/1977 | George | |
| 4,114,789 A | 9/1978 | Blaylock et al. | |
| 4,449,656 A | 5/1984 | Wouden | |
| 4,500,020 A | 2/1985 | Rasor | |
| 4,534,496 A | 8/1985 | Bott | |
| 4,640,450 A | 2/1987 | Gallion et al. | |
| 4,671,004 A | 6/1987 | Berg | |
| D294,137 S | 2/1988 | Robson | |
| D296,087 S | 6/1988 | Luck | |
| 4,768,691 A | 9/1988 | Stapleton | |
| 4,778,092 A | 10/1988 | Grace | |
| D306,990 S | 4/1990 | Bott | |
| 4,972,983 A | 11/1990 | Bott | |
| 4,982,886 A | 1/1991 | Cucheran | |
| D314,983 S | 2/1991 | Cangianni et al. | |
| 4,993,615 A | 2/1991 | Arvidsson | |
| 5,016,798 A | 5/1991 | Stapleton et al. | |
| 5,038,988 A | 8/1991 | Thulin | |
| D320,971 S | 10/1991 | Sparham et al. | |
| 5,104,020 A | 4/1992 | Arvidsson et al. | |
| D326,282 S | 5/1992 | Spoljaric | |
| 5,132,666 A | 7/1992 | Fahs | |
| 5,170,920 A | 12/1992 | Corrente et al. | |
| 5,171,083 A | 12/1992 | Rich | |
| 5,207,365 A | 5/1993 | Bott | |
| 5,306,156 A | 4/1994 | Gibbs et al. | |
| 5,347,736 A | 9/1994 | Kanigan | |
| 5,385,285 A | 1/1995 | Cucheran et al. | |
| 5,474,218 A | 12/1995 | Arsenault, Jr. et al. | |
| 5,560,525 A | 10/1996 | Grohmann et al. | |
| D398,409 S | 9/1998 | Jessa | |
| 5,826,766 A | 10/1998 | Aftanas | |
| 5,845,828 A | 12/1998 | Settelmayer | |
| 5,871,190 A | 2/1999 | Henriksson | |
| 5,979,723 A | 11/1999 | Tress et al. | |
| 6,050,467 A | 4/2000 | Drouillard et al. | |
| D430,901 S | 9/2000 | Palmer | |
| 6,116,486 A | 9/2000 | Lindell | |
| 6,378,747 B1 | 4/2002 | Fisch et al. | |
| 6,415,970 B1 | 7/2002 | Kmita et al. | |
| D486,188 S | 2/2004 | Norcross et al. | |
| 6,701,143 B1 | 3/2004 | Dukach et al. | |
| 6,812,851 B1 | 11/2004 | Dukach et al. | |
| 6,850,209 B2 | 2/2005 | Mankins et al. | |
| 7,134,764 B1 | 11/2006 | Bieberdorf | |
| 7,434,713 B2 | 10/2008 | Linden | |
| D634,722 S | 3/2011 | Kim et al. | |
| D635,614 S | 4/2011 | Yan | |
| D639,340 S | 6/2011 | Martin | |
| D647,970 S | 11/2011 | Strempack | |
| D654,116 S | 2/2012 | McDougall et al. | |
| 8,122,628 B2 | 2/2012 | Johnson, Jr. | |
| D657,421 S | 4/2012 | Yan | |
| D657,422 S | 4/2012 | Yan | |
| D669,938 S | 10/2012 | Lard et al. | |
| D704,265 S | 5/2014 | Yan | |
| 8,895,836 B2 | 11/2014 | Amin et al. | |
| 9,121,391 B1 | 9/2015 | Koehler, III | |
| 9,135,839 B2 | 9/2015 | Remenda | |
| D740,472 S | 10/2015 | Linton et al. | |
| D763,357 S | 8/2016 | Tsuru et al. | |
| D765,660 S | 9/2016 | Kim et al. | |
| 9,451,060 B1 | 9/2016 | Bowers et al. | |
| 9,516,485 B1 | 12/2016 | Bowers et al. | |
| D775,989 S | 1/2017 | Kalanick et al. | |
| D777,258 S | 1/2017 | Strempack et al. | |
| 9,622,392 B1 | 4/2017 | Bowers et al. | |
| D793,890 S | 8/2017 | Hong | |
| D815,690 S | 4/2018 | Squillante | |
| 9,994,160 B2 | 6/2018 | Kim et al. | |
| D848,528 S | 5/2019 | Lee et al. | |
| D848,529 S | 5/2019 | Lee et al. | |
| 10,326,962 B2 | 6/2019 | Hamilton | |
| 10,486,618 B2 | 11/2019 | Hornsby et al. | |
| D869,378 S | 12/2019 | Hornsby et al. | |
| D878,467 S | 3/2020 | Hornsby et al. | |
| D879,202 S | 3/2020 | Hornsby et al. | |
| 2002/0009978 A1 | 1/2002 | Dukach et al. | |
| 2002/0065046 A1 | 5/2002 | Mankins et al. | |
| 2002/0084891 A1 | 7/2002 | Mankins et al. | |
| 2002/0112026 A1 | 8/2002 | Fridman et al. | |
| 2002/0164962 A1 | 11/2002 | Mankins et al. | |
| 2003/0119448 A1 | 6/2003 | Arntz | |
| 2004/0004827 A1 | 1/2004 | Guest | |
| 2004/0036622 A1 | 2/2004 | Dukach et al. | |
| 2004/0170013 A1 | 9/2004 | Smythe | |
| 2004/0182898 A1 | 9/2004 | Harris | |
| 2005/0116511 A1 | 6/2005 | Leroy et al. | |
| 2006/0091170 A1 | 5/2006 | Almhil | |
| 2007/0108243 A1 | 5/2007 | Bingham | |
| 2007/0158965 A1 | 7/2007 | Van Smirren | |
| 2008/0236007 A1 | 10/2008 | Au et al. | |
| 2010/0079979 A1 | 4/2010 | Nakamichi et al. | |
| 2010/0282799 A1 | 11/2010 | Hubbard | |

(56) References Cited

U.S. PATENT DOCUMENTS

| | | | |
|---|---|---|---|
| 2011/0072697 | A1 | 3/2011 | Miller |
| 2011/0132946 | A1 | 6/2011 | Sautter et al. |
| 2011/0298841 | A1 | 12/2011 | Fujimori |
| 2011/0315726 | A1 | 12/2011 | Huhn et al. |
| 2012/0002357 | A1 | 1/2012 | Auld et al. |
| 2012/0224116 | A1 | 9/2012 | Barnes |
| 2012/0312848 | A1 | 12/2012 | Delusky et al. |
| 2013/0098425 | A1 | 4/2013 | Amin et al. |
| 2013/0173358 | A1 | 7/2013 | Pinkus |
| 2014/0293605 | A1 | 10/2014 | Chemel et al. |
| 2015/0129625 | A1 | 5/2015 | Gorey et al. |
| 2015/0175082 | A1 | 6/2015 | Aftanas et al. |
| 2015/0232038 | A1 | 8/2015 | Robertson |
| 2015/0274084 | A1 | 10/2015 | Sargès et al. |
| 2015/0369274 | A1 | 12/2015 | Stojkovic et al. |
| 2015/0381922 | A1* | 12/2015 | Hamilton ............... H04N 5/655 348/837 |
| 2016/0041423 | A1 | 2/2016 | Dunn |
| 2017/0029043 | A1 | 2/2017 | Clark et al. |
| 2017/0050576 | A1 | 2/2017 | Ferman |
| 2017/0111486 | A1 | 4/2017 | Bowers et al. |
| 2017/0111520 | A1 | 4/2017 | Bowers et al. |
| 2017/0132960 | A1 | 5/2017 | Kis-Benedek Pinero et al. |
| 2017/0257978 | A1 | 9/2017 | Diaz |
| 2018/0170270 | A1 | 6/2018 | Bergman |
| 2018/0272959 | A1 | 9/2018 | Hornsby et al. |
| 2018/0293921 | A1 | 10/2018 | Margrill |
| 2018/0317330 | A1* | 11/2018 | Dunn .................. G09F 13/0445 |
| 2019/0295386 | A1 | 9/2019 | Roberts |
| 2020/0010025 | A1 | 1/2020 | Hornsby et al. |
| 2020/0039450 | A1 | 2/2020 | Hornsby et al. |
| 2020/0207284 | A1 | 7/2020 | Hornsby et al. |
| 2021/0066923 | A1 | 3/2021 | Dunn et al. |
| 2022/0270135 | A1* | 8/2022 | Terzian .................. B60R 11/04 |

FOREIGN PATENT DOCUMENTS

| | | |
|---|---|---|
| AU | 201815721 | 10/2018 |
| CA | 183485 | 12/2019 |
| CA | 183486 | 12/2019 |
| CA | 183487 | 12/2019 |
| CN | 106782121 A | 5/2017 |
| CN | 109961695 A | 7/2019 |
| DE | 202007017477 U1 | 6/2008 |
| EM | 005638509-0001 | 9/2018 |
| EM | 005638541-0001 | 9/2018 |
| EM | 005638558-0001 | 9/2018 |
| EP | 0476288 A1 | 3/1992 |
| EP | 3602534 A1 | 2/2020 |
| JP | 2012-16086 A | 1/2012 |
| JP | 2012-255847 A | 12/2012 |
| JP | 2012-255848 A | 12/2012 |
| JP | 1634158 S | 5/2019 |
| JP | 1634159 S | 5/2019 |
| JP | 1660382 S | 5/2020 |
| KR | 10-0917344 B1 | 9/2009 |
| KR | 10-1444022 B1 | 10/2014 |
| KR | 30-1045258 | 2/2020 |
| KR | 30-1045259 | 2/2020 |
| KR | 30-1045260 | 2/2020 |
| WO | 2018/175888 A1 | 9/2018 |
| WO | 2021/041381 A1 | 3/2021 |

OTHER PUBLICATIONS

LG-MRI, BoldVu Vehicle Top Displays, via Internet Archive Wayback Machine at URL: https://web.archive.org/web/20190327001140/https://lg-mri.com/digital-taxi-top-display/, Mar. 27, 2019, 8 pages.
McGarryBowen, Inside the Campaign: United Airlines "Real Time Taxi", https://www.aaaa.org/inside-campaign-united-airlines-real-time-taxi-mcgarrybowen-media-partners-kinetic-mec-verifone/, Jul. 7, 2017, 6 pages, American Association of Advertising Agencies.
RAVE, DSE 2017: LG-MRI Presents TaxiVu, a Digital LCD Display for Mobile Advertising, video at https://www.youtube.com/watch?v=CmNw40BT6ZE, Mar. 30, 2017, 1 page.
RAVE, DSE 2018: LG-MRI Highlights BoldVu Vehicle Top Display, VT1145LD, for DOOH Advertising, video at https://www.youtube.com/watch?v=IYSMhCnMyhg, Apr. 1, 2018, 1 page.
AdNation, Turn Key Solutions, May 23, 2017, 4 pages.
Gizmodo, Uber Will Puts Ads on Top of Vehicles Just Like Old-School Taxis, Feb. 24, 2020, 4 pages.
The Street, Lyft Acquires Halo Cars, a Startup That Places Ads on Vehicles, Feb. 21, 2020, 2 pages.
MarketingDive, Puma brings targeted hologram ads to car roofs for NBA All-Star game, Feb. 20, 2020, 3 pages.
Deploy Solution, Melford Technologies homepage, Mar. 3, 2020, 4 pages.
Commercial Integrator, WaiveCar Brings Car Sharing and Digital Signage Together with Help from BrightSign, Jul. 6, 2018, 9 pages.
Vertical Digital Displays, Innovation on Display FlexVu Totem Brochure, 2014, 6 pages.
Vertigo Digital Displays, FlexVu Totem Shelter, 2017, 2 pages.
Vertical Digital Displays, All Products Cataogue, 2017, 14 pages.
Vertical Digital Displays, FlexVue Ferro 55P/55L, Mar. 16, 2017, 4 pages.
CIVIQ Smartscapes, There are companies that make kiosks. And then there's CIVIQ.—Advanced Smart City Platform, webpage, Jan. 30, 2019, 10 pages.
CIVIQ Smartscapes, Connecting people, places & experiences, webpage, Jan. 30, 2019, 5 pages.
CIVIQ Smartscapes, Connecting people, places & experiences, screen shot of devices webpage, Jan. 30, 2019, 1 page.
Manufacturing Resources International, Manufacturing Resources International home webpage, Nov. 4, 2019, 2 pages.
Manufacturing Resources International, LCD Display Deployments webpage, Nov. 4, 2019, 3 pages.
Manufacturing Resources International, BoldVu Outdoor LCD Display webpage, Nov. 4, 2019, 2 pages.
Manufacturing Resources International, BoldVu Semi Outdoor LCD Display webpage, Nov. 8, 2019, 2 pages.
Manufacturing Resources International, BoldVu Vehicle Top LCD Display webpage, Nov. 8, 2019, 2 pages.
Manufacturing Resources International, Drivethru Menu Boards Webpage, Nov. 8, 2019, 2 pages.
Manufacturing Resources International, Storefront Digital Signage webpage, Nov. 8, 2019, 2 pages.
Melford Technologies, Part 1, video online at https://m.youtube.com/watch?v=OAV7zzVrHtE&feature=youtu.be, Oct. 21, 2019, 1 page.

* cited by examiner

SOLAR POWERED VEHICLE TOPPER UNIT

CROSS-REFERENCE TO RELATED APPLICATIONS

This application claims the benefit of U.S. Provisional Application No. 62/892,104 filed on Aug. 27, 2019 and U.S. Provisional Application No. 62/911,806 filed Oct. 7, 2019, the disclosures of each of which are hereby incorporated by reference as if fully restated herein.

TECHNICAL FIELD

Exemplary embodiments relate generally to vehicle topper units ("VTUs") with solar panels.

BACKGROUND AND SUMMARY OF THE INVENTION

Electronic displays are increasingly replacing physical billboards, bulletins, posters, flyers, banners, and other physical signage for public announcements, advertising, and the like. It is known to provide such physical signage along sidewalks, along roadsides, at bus shelters, on poles, at drive throughs, on VTUs, and the like. It is also known to provide ruggedized electronic display assemblies for indoor, outdoor, and semi-outdoor use. Such displays may protect the electronic displays and related components from the elements, vandalism, theft, and the like. Such displays may include those available from Manufacturing Resources International, Inc. of Alpharetta, Georgia (https://mri-inc.net/). Such displays may be configured to display public announcements, advertising, and the like. It is known to provide such displays on sidewalks, on the ground, in windows, at bus shelters, at drive throughs, on the tops of vehicles, and the like to replace physical signage.

Advancements in solar energy are making solar panels more compact and efficient. Electronic display assemblies require power for operation. For example, such electronic display assemblies utilize lights, electronic displays, fans and other cooling equipment, electrical circuitry, and other electrically powered equipment which requires electrical power for operation. In the case of ground mounted units, such power is generally provided by the electrical grid. In the case of VTUs, such power is generally provided by the vehicle. While VTUs may provide an extra source of revenue for vehicle drivers or companies, generally by displaying advertising for others, the extra weight of a VTU may reduce fuel efficiency, which negates some or all of the extra revenue. What is needed is a solar powered VTU.

Systems and methods for solar powered VTUs are disclosed herein. The VTU may be configured for outdoor use atop a vehicle such as, but not limited to, a taxi cab, a personal vehicle, a commercial vehicle, a limousine, a town car, a bus, an SUV, a rideshare vehicle, or the like. The VTU may comprise two electronic displays placed in a back-to-back arrangement, though any number, type, size, and orientation of electronic displays may be utilized.

One or more supports may extend between the VTU and one or more solar energy harvesting devices such that the one or more solar energy harvesting devices are elevated above a housing for VTU. This may provide the clearance needed for the performance of maintenance efforts on the electronic display assembly, such as the ability to open various access panels of the VTU.

The elevation of the one or more solar energy harvesting devices may also cast shade on various components of the VTU, such as but not limited to, one or more of the electronic displays. This may improve the contrast of images displayed on the electronic display(s). This may also lower brightness requirements. This may also reduce cooling needs. For example, without limitation, fans may be run at lower speeds or not at all. In exemplary embodiments, the one or more solar energy harvesting devices may be longer and/or wider than the VTU to provide shade. This may also increase the available area for solar power. Any number, size, type, location, and orientation of such solar energy harvesting devices may be utilized.

Power generated by the solar energy harvesting devices may be used to power the VTU, or select components thereof, when conditions are sufficiently sunny. Additional energy may be stored at one or more energy storage devices. In exemplary embodiments, the energy storage devices may be batteries within the VTU or the vehicle. Where the power generated by the one or more solar energy harvesting devices is sufficient to power the VTU, power may be drawn solely from the one or more solar energy harvesting devices. Where the power generated by the one or more solar energy harvesting devices is insufficient to power the VTU, additional power may be drawn to supplement the power generated by the one or more solar energy harvesting devices from the one or more energy storage devices.

For example, without limitation, when a gasoline or other like powered vehicle is idle the engine is often shut off. This results in shutting down the alternator and powering any electrical equipment, such as the VTU, by draining power from the vehicle battery. Of course, with electrically powered vehicles, as another example without limitation, powering any electrical device requires draining charge from the batteries. With the present invention, the VTU could be partially or wholly powered by the solar energy harvesting devices. Energy needs may be supplemented by the energy storage devices to reduce or eliminate the drain on the energy storage devices, such as but not limited to the vehicle battery.

The shade cast by the solar energy harvesting devices may also cool the interior of the vehicle, reducing the need to run air conditioning. This may provide increased efficiency.

Often times, vehicle drivers are required to return their vehicle with a full amount of fuel (such as but not limited to, a full tank of gas, a full battery charge, some combination thereof, or the like). The power supplied by the solar energy harvesting devices, and/or the efficiency gains experienced by the shade cast by the solar energy harvesting devices, may be sufficient to negate some or all of the fuel efficiencies losses experienced from addition of the VTU, and/or exceed the fuel efficiencies losses such that fuel efficiency is improved. The use of such solar energy harvesting devices may reduce the environmental impact of such electronic display assemblies.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 through FIG. 4 illustrate an exemplary VTU 10. A mounting system 14 may be provided for mounting the VTU 10 to a vehicle 12. The mounting system 14 may comprise one or more crossbars 16. The crossbars 16 may be configured for securement to a roof 13 of a vehicle 12. A housing 20 for the VTU 10 may be mounted to the crossbars 16. The crossbars 16 may be any size, shape, type, cross-section, or the like. Any number of crossbars 16 may be utilized. While the VTU 10 is illustrated as mounted to the roof 13 of the vehicle 12, the VTU 10 may be mounted to any portion of the vehicle 12. In other exemplary embodiments, the VTU 10 may be mounted directly to the vehicle 12. The VTU 10 may be mounted in any orientation relative to the vehicle 12. The mounting system 14 may further comprise one or more bolts, screws, brackets, fasteners, adapters, some combination thereof, or the like for mounting the VTU 10 to the crossbars 16 and/or the crossbars 16 to the vehicle 12. Alternatively, or additionally, adhesive, welding, bonding, some combination thereof, or other joining techniques may be utilized.

One or more supports 36 may be provided. The supports 36 may extend vertically between the housing 20 and each of one or more solar energy harvesting devices 24. The supports 36 may be mounted to the housing 20 at a first end. The supports 36 may be mounted to lifting eyes located on said housing 20. In other exemplary embodiments, the supports 36 may extend into or through some or all of the housing 20 and may be mounted to one or more internal structural components of the VTU 10 and/or one or more components of the mounting system 14, such as but not limited to, the crossbars 16. In exemplary embodiments, a first support 36 is placed on a proximal portion of the VTU 10, and a second support 36 is placed on a distal portion of the VTU 10, though any number and arrangement of the supports 36 may be utilized. The supports 36 may be substantially rectangular in shape, though any shape may be utilized. The supports 36 may be mounted to the solar energy harvesting devices 24 at a second end. In exemplary embodiments, the supports 36 are secured to an underside of a substrate 32 for the solar energy harvesting devices 24.

The supports 36 may be configured to elevate a bottom surface of the solar energy harvesting device 24 from an upper surface of the VTU 10. This may facilitate access to the VTU 10 for maintenance and servicing efforts, for example without limitation. For example, without limitation, the VTU 10 may comprise one or more side assemblies 22. Each side assembly 22 may comprise an electronic display 18. Each side assembly 22 may be configured to swing or otherwise rotate, pivot, or move outwardly to facilitate access to the components located inside the side assembly 22 and/or other portions of the VTU 10, which may include signage, cooling pathways, lights, fans, electronic displays, mounting components, structural components, electrical circuitry, various electronics for operating the VTU 10 and/or the solar energy harvesting device 24, some combination thereof, or the like. Each side assembly 22 may comprise an electronic display layer, a transparent cover panel, a backlight, some combination thereof, or the like. The backlight may comprise direct backlighting, edge lighting, some combination thereof, or the like. In other exemplary embodiments, a separate backlight may not be required as the electronic display 18 may be an emissive type display, such as but not limited to organic light emitting diode type displays. The electronic display 18 may be any type of electronic display such as, but not limited to, liquid crystal, organic light emitting diode, light emitting diode, cathode ray tube, plasma, some combination thereof, or the like.

In exemplary embodiments, at least 5 inches of clearance may be provided between an upper surface of the VTU 10 and a lower surface of the solar energy harvesting device 24, though any distance, or varying distances, may be utilized. The clearance may facilitate the casting of shade on the electronic display 18, the VTU 10, the interior of the vehicle 12, some combination thereof, or the like when in use. The clearance may, additionally or alternatively, provide certain desirable aerodynamic effects.

One or more additional supports 34 may be provided. The additional supports 34 may extend horizontally along a lower surface of the substrate 32. The additional supports 34 may extend from either side of each of the one or more supports 36. In exemplary embodiments, the additional supports 34 may be sandwiched between an upper surface of each of the one or more supports 36 and a lower surface of the substrate 32. The additional supports 34 may be provided under some or all of the solar energy harvesting device 24 and may provide structural stability, strength, and/or rigidity.

In exemplary embodiments, the solar energy harvesting device 24 may be substantially rectangular in shape. The solar energy harvesting device 24 may have a width W2 that is greater than the width W1 of the VTU 10. Alternatively, or additionally, the solar energy harvesting device 24 may have a length L2 that is greater than the length L1 of the VTU 10. The width dimensions W1, W2 and the length dimensions L1, L2 may be maximum width and length dimensions, respectively, for the solar energy harvesting device 24 and the VTU 10, respectively. Stated another way, the solar energy harvesting device 24 may have a larger footprint than the footprint of the VTU 10. This may provide for increased surface area for collecting solar energy. This may, additionally or alternatively, shade some or all of the VTU 10, various components thereof (such as but not limited to the electronic display 18), and/or the vehicle 12 when placed in outdoor environments. Such shade may result in better image quality, including, but not limited to, improvised color saturation, contrast, some combination thereof, or the like. This may reduce the brightness levels needed to drive the electronic displays 18, thus resulting in reduced cooling needs. The shade may also decrease solar loading, thus reducing cooling needs. Any size, shape, number, type, and orientation of the solar energy harvesting device 24 may be utilized.

The solar energy harvesting device 24 may comprise one or more photovoltaic cells 28. The photovoltaic cells 28 may be mounted to one or more substrates 32. Normally, the photovoltaic cells 28 and/or the substrate 32 may comprise rough edges. A side edge 26 may be provided around an outer edge of the photovoltaic cells 28 and/or the substrate 32. The side edge 26 may provide a smoother surface which is safer for pedestrian interaction and is more aesthetically appealing.

One or more antenna 30 may be provided at the solar energy harvesting device 24. The antenna 30 may be mounted to the substrate 32. In exemplary embodiments, a first antenna 30 may be provided on a front portion of the substrate 32 and a second antenna 30 may be provided on a rear portion of the substrate. The antenna 30 may be centered with respect to the side edges of the substrate 32. However, any number and position of antenna 30 may be utilized. The antenna may be configured to receive and/or transmit radio signals, cellular signals, GPS or other location tracking signals, Bluetooth® or other near field communication signals, some combination thereof, or the like. In this way, the antenna 30 may have minimal obstructions for improved transmitting and/or receiving of signals.

One or more cameras 44 may be provided at the solar energy harvesting device 24. The cameras 44 may be mounted to the substrate 32. In exemplary embodiments, a first and second camera 44 may be provided on the left and right sides of the substrate 32 which may be centered from the front to the back, though any number and positioning of the cameras 44 may be utilized. The cameras 44 may be in electronic communication with the antenna 30, though such is not required.

The solar energy harvesting device 24 may be in electrical connection with various components of the VTU 10, such as but not limited to, the electronic displays 18. Additionally, the solar energy harvesting device 24 may be in electrical connection with one or more energy storage devices 38. Additionally, or alternatively, the solar energy harvesting device 24 may be in electrical connection with one or more energy sources 40. The energy storage device 38 may comprise one or more batteries. The energy sources 40 may comprise one or more batteries, alternators, some combination thereof, or the like. In exemplary embodiments, the energy storage device 38 and the energy source 40 may be one and the same, though such is not required.

A controller 42 may be interposed between one or more of: the solar energy harvesting device 24, the VTU 10, the energy storage device 38, and the energy source 40. The controller 42 may be configured to determine when to draw power from the solar energy harvesting device 24 and when to supplement the energy needs with power from the energy storage device 38 and/or the energy source 40.

While certain components, such as but not limited to, the energy storage device 38, the energy source 40, and the controller 42 are illustrated as being located outside of the VTU 10 and the solar energy harvesting device 24, such components may be, partially or entirely, internal to the VTU 10 and/or the solar energy harvesting device 24. Such components may be placed at any location.

The mounting of the supports 36, and/or other components described herein, may be performed by fasteners (such as but not limited, to rivet nuts, bolts, screws, nails, some combination thereof, or the like), adhesives, welding, bonding, some combination thereof, or the like. The vehicle 12 may be gasoline powered, hybrid powered (e.g., gasoline and electric), diesel powered, electric powered, fuel cell powered, hydrogen powered, human powered, some combination thereof, or the like. The vehicle 12 may be any type of vehicle, including for example without limitation, a personal vehicle, a commercial vehicle, a rideshare vehicle, a taxi cab, a limousine, a town car, a bus, an SUV, a sedan, trailer, bus, motorcycle, scooter, tricycle, or the like.

The VTU 10 may comprise one or more sensors 11 such as, but not limited to, temperature sensors, fan speed sensors, ambient light sensors, accelerometers, some combination thereof, or the like. In this way, the amount of cooling, the brightness of the electronic displays 18, the speed of the fans, some combination thereof, or the like may be adjusted based on ambient temperature, vehicle 12 movement, ambient lighting conditions (including but not limited to the amount of shade cast), some combination thereof, or the like.

Figure 1:
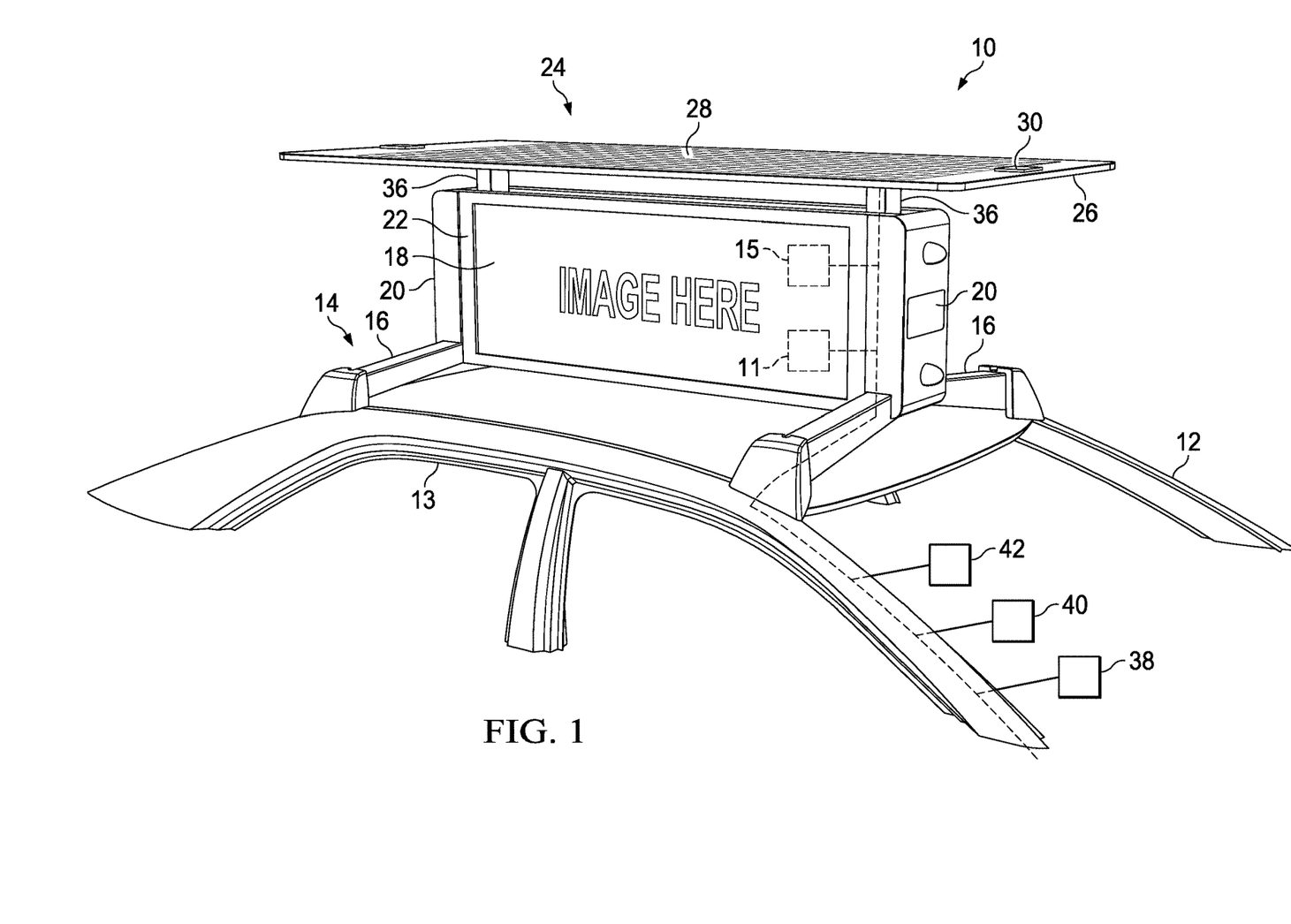
FIG. 1 is a front perspective view of an exemplary VTU with an exemplary solar energy harvesting device with certain internal components revealed and illustrated in simplified form.
Figure 2:
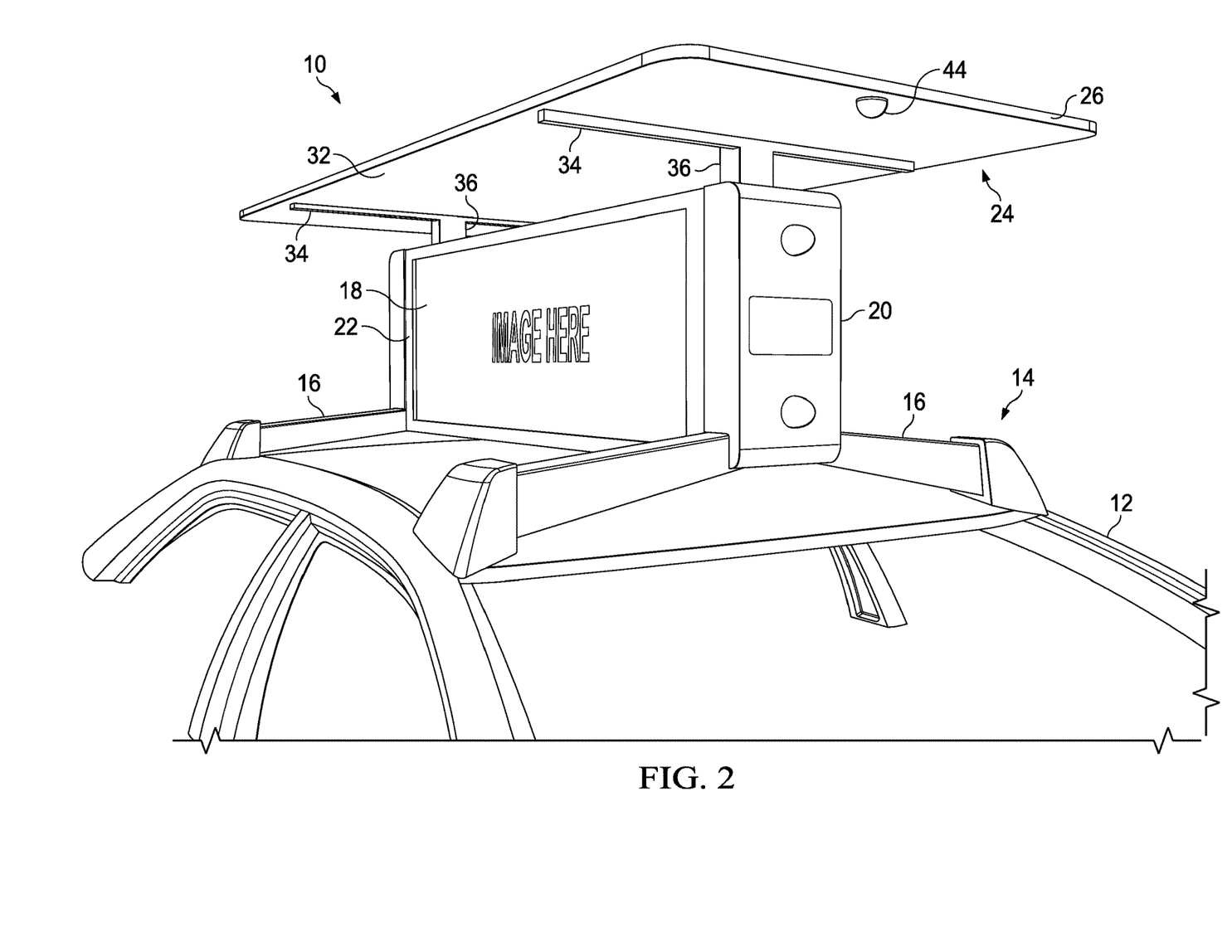
FIG. 2 is a left side perspective view of the VTU of FIG. 1.
Figure 3:
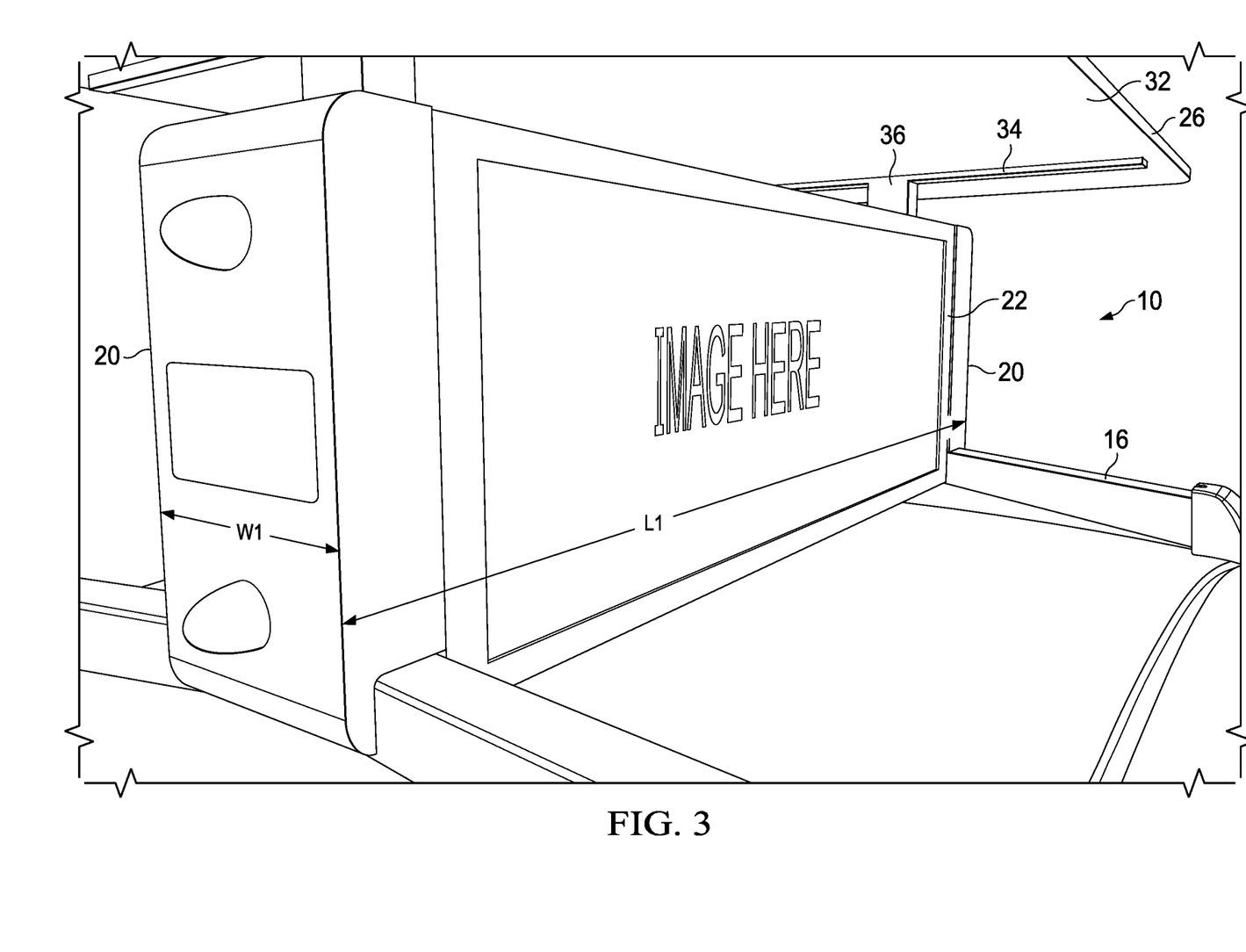
FIG. 3 is an enlarged, right side perspective view of the VTU of FIG. 1.
Figure 4:
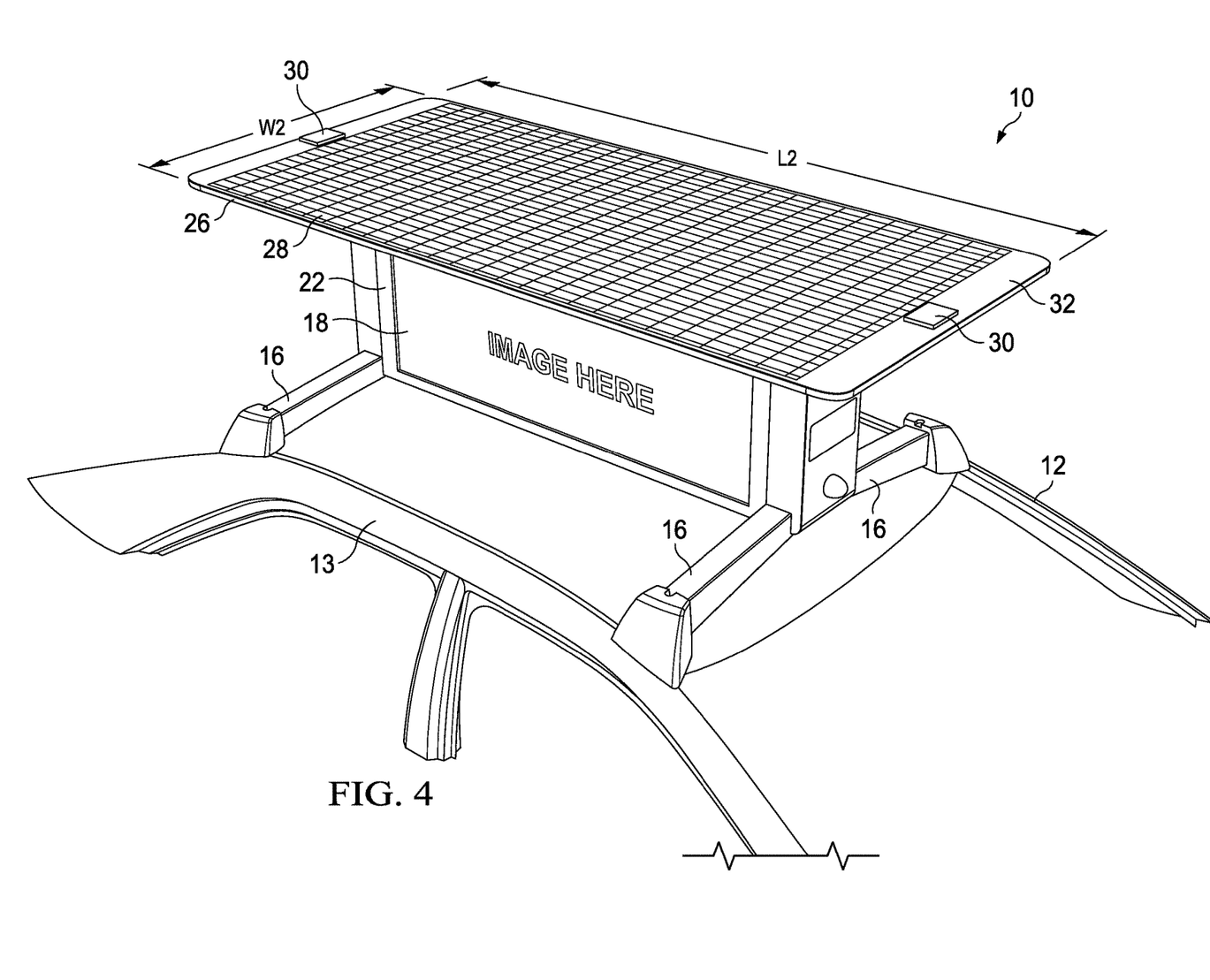
FIG. 4 is a top perspective view of the VTU of FIG. 1.
Figure 5:
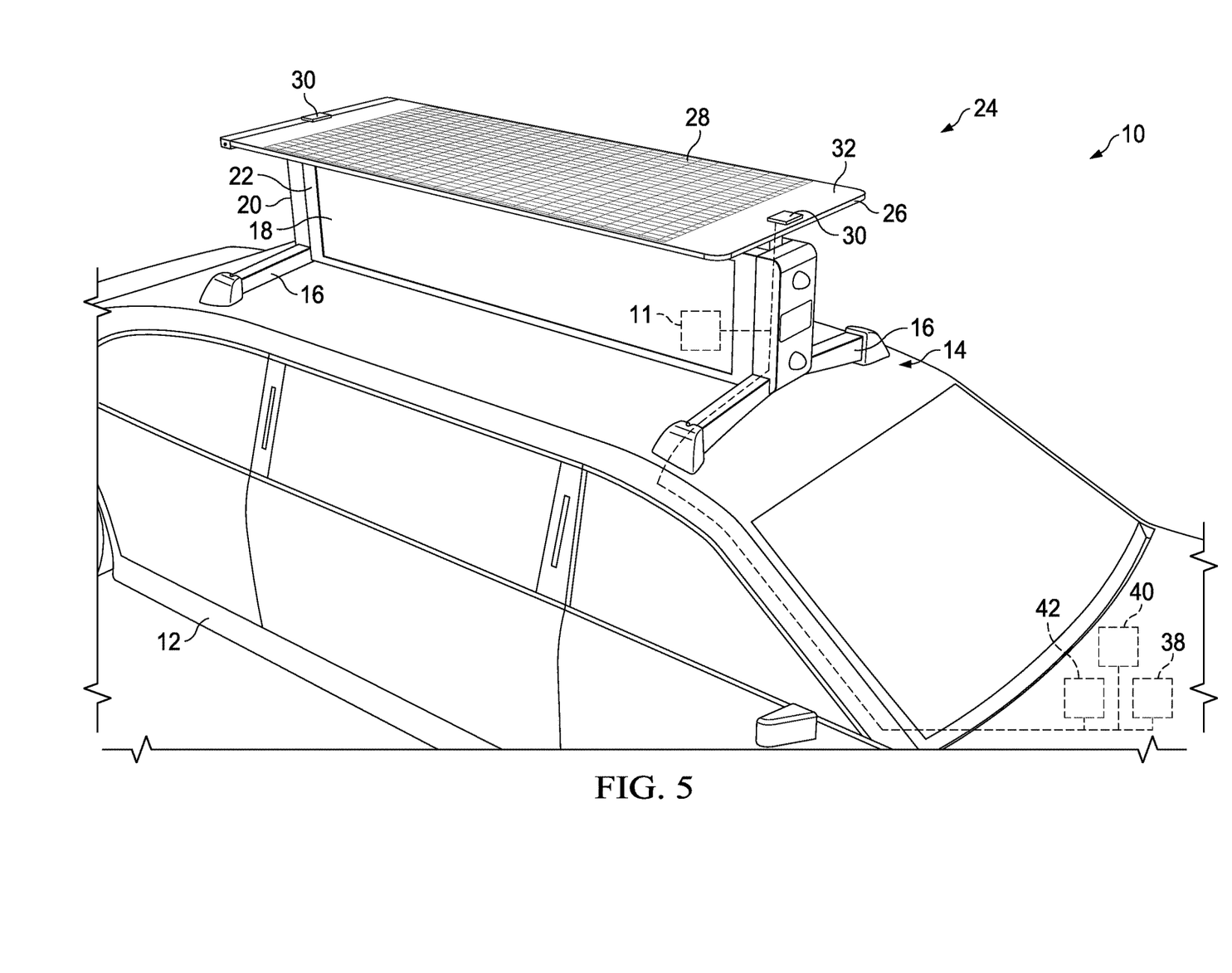
FIG. 5 is a front perspective view of another exemplary VTU with another exemplary solar energy harvesting device with certain internal components revealed and illustrated in simplified form.
Figure 6:
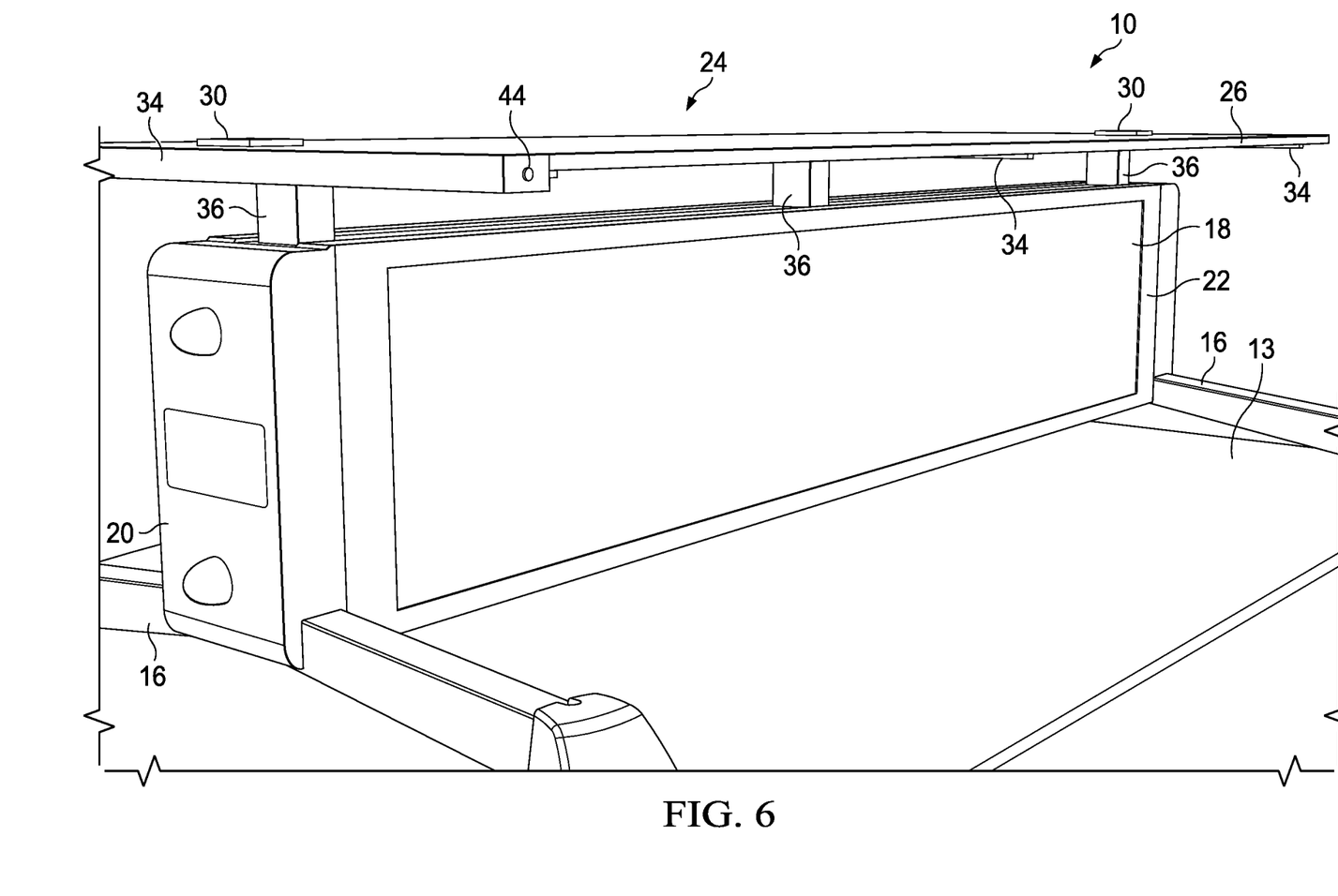
FIG. 6 is an enlarged, right side perspective view of the VTU of FIG. 5.
Figure 7:
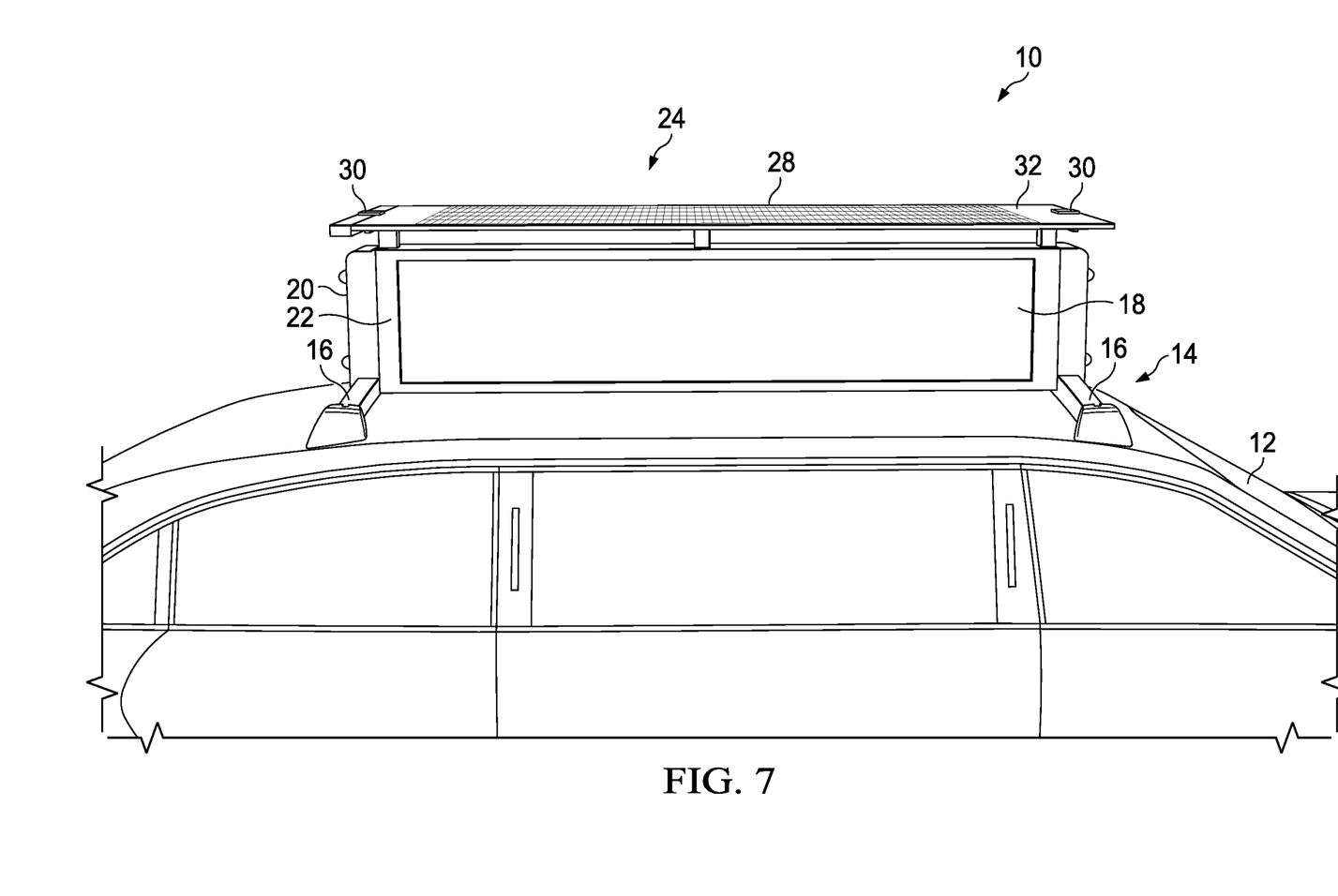
FIG. 7 is a left side view of the VTU of FIG. 5.

FIG. 5 through FIG. 7 illustrate another exemplary VTU 10. An elongated VTU 10 may be provided on a particularly long vehicle 12, such as but not limited to, a limousine, bus, RV, trailer, or the like. In such embodiments, an elongated solar energy harvesting device 24 may be provided with multiple supports 36. In other exemplary embodiments, multiple solar energy harvesting devices 24 may be provided in a substantially linear fashion along the VTU 10. Any size, number, and arrangement of electronic display 18 and solar energy harvesting devices 24 may be utilized for any size and type of vehicle 12.

In exemplary embodiments, the camera 44 may be positioned on a distal end of one or more of the additional supports 34, though such is not required. Any number and position of the cameras 44 may be utilized.

The VTU 10 may be substantially rectangular in shape, though the VTU 10 may be provided in any size and/or shape. Any of the solar energy harvesting devices 24 may utilize opaque, transparent, or translucent panels. Some or all of the solar energy harvesting devices 24 may be configured to swivel, pivot, tilt, rotate, some combination thereof, or the like. Such movement may be accomplished manually or automatically, such as by motor and controller configured to track the sun's movement. The solar energy harvesting devices 24 may be provided in any size, shape, orientation (e.g., flush or mounted at an angle), number, type, or the like. Each solar energy harvesting device 24 may comprise any number of photovoltaic cells.

Figure 8:
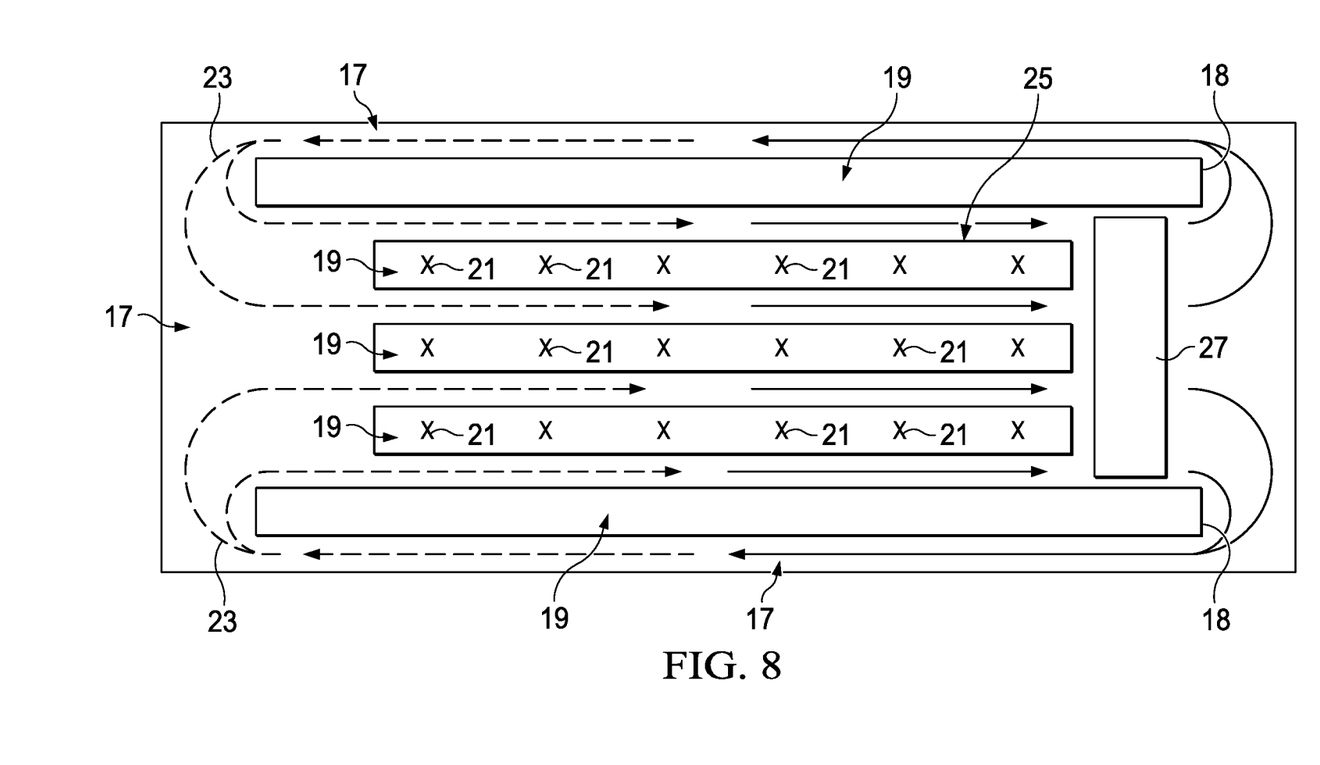
FIG. 8 is a top sectional view of another exemplary VTU.

FIG. 8 illustrates a top sectional view of the VTU 10. The VTU 10 comprise one or more cooling pathways. Such cooling pathways may comprise openings configured to ingest and exhaust ambient air 21 into and out of one or more open loop pathways 19. In exemplary embodiments, the open loop pathways may pass along backlights for the electronic displays 18. Such cooling pathways may include, additionally or alternatively, closed loop pathways 17 located entirely within the VTU 10 for circulating gas 23. In exemplary embodiments, the closed loop pathways 17 may encircle the electronic display(s) 18 by passing through a gap between the transparent cover panel and the electronic display 18 of a given side assembly 22. One or more electronic components for operating the VTU 10 may be provided within or along the closed loop pathways 17. One or more fans may be provided within or along the open loop pathways 19 to force ambient air therethrough. One or more fans 27 may be provided within or along the closed loop pathways 17 to force circulating gas therethrough. A heat exchanger 25 may be provided, preferably behind the electronic display(s) 18, to permit heat transfer between the relatively warm circulating gas 23 in the closed loop pathways 17 and the relatively cool ambient air 21 in the open loop pathways 19.

Figure 9:
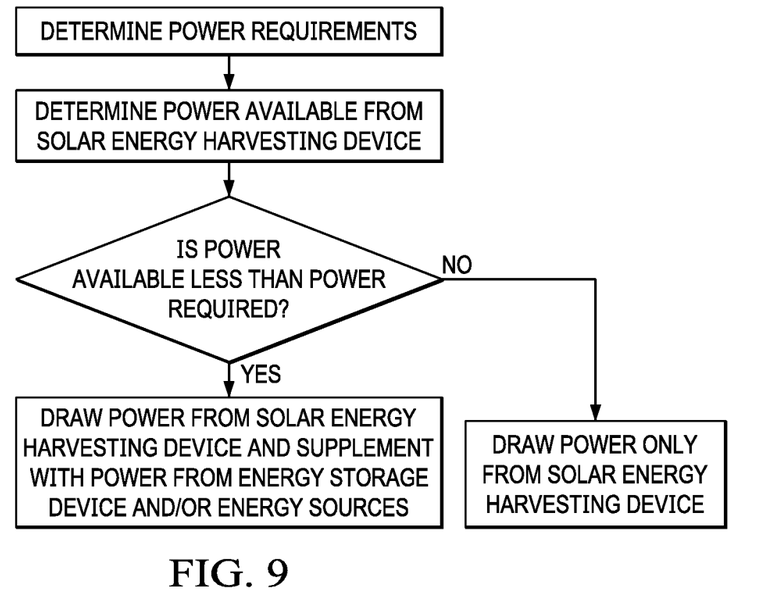
FIG. 9 is a flowchart with exemplary logic for operating the VTU of FIGS. 1-8.

FIG. 9 provides a flowchart with exemplary logic for operating the VTU 10 and related components. The controller 42 may determine the amount of power required to operate the VTU 10. This determination may be made, at least in part, based on readings from the sensors 11, operational data from the VTU 10, historical information, predictions, some combination thereof, or the like. During sufficiently sunny conditions, the controller 42 may be configured to direct power collected from the solar energy harvesting device 24 to the VTU 10. Where sufficient energy is collected, the controller 42 may be configured to power the VTU 10 only with energy generated by the one or more solar energy harvesting devices 24. Where the power generated by the one or more solar energy harvesting devices 24 is insufficient to power the VTU 10, the controller 42 may be configured to supplement the power supplied by the one or more solar energy harvesting devices 24 with power from the one or more energy storage devices 38. In this way, power may be drawn from the energy storage devices 38 and/or energy sources 40. Power may be drawn from the energy storage devices 38 and/or energy sources 40 only when needed, and only as much as needed to supplement the power generated by the one or more solar energy harvesting devices 24 to meet the power requirements of the VTU 10. In this way, the burden on the energy storage devices 38 and/or energy sources 40 may be reduced or eliminated. Furthermore, the VTU 10 may be periodically, continuously, partially, or wholly powered by the solar energy harvesting device 24. For certain vehicles 12, this may result in improved gas mileage, among other benefits, though such is not required. This may also reduce environmental impact of the VTU 10.

The controller 42 may be configured to monitor electrical draw and/or needs for the VTU 10. The controller 42 may, alternatively or additionally, be configured to monitor electrical production from the solar energy harvesting device 24. Electrical draw, needs, and/or production may be monitored by measuring one or more of the following: current, wattage, voltage, some combination thereof, or the like. The controller 42 may, alternatively or additionally, be configured to monitor one or more of the following: ambient lighting conditions (by way of one or more ambient light sensors 11), forecasted weather conditions (by way of network accessible weather data accessed by way of a network connectivity device 15), current or forecasted electrical billing rates (by way of network accessible rate data accessed by way of a network connectivity device 15), user preferences (received by way of the network connectivity device 15), some combination thereof, or the like. The controller 42 may be configured to utilize such information to determine which energy source(s) to utilize.

Operations of the VTU 10 may be adjusted to raise or lower power requirements of the VTU 10. For example, without limitation, where the power required for VTU 10 operations is less than the power generated by the solar energy harvesting device 24, certain operations may be adjusted such as, but not limited to, increasing backlight levels to improve image quality. As another example, without limitation, where the power required for VTU 10 operations is greater than the power generated by the solar energy harvesting device 24 by a predetermined amount, certain operations may be adjusted, such as but not limited to, by decreasing backlight levels such that the solar energy harvesting device 24 may fully or more completely power the VTU 10.

In exemplary embodiments, the electrical systems may be entirely direct current ("DC"). For example, without limitation, the VTU 10, the solar energy harvesting devices, the energy storage devices 38, the energy sources 40, the controller 42, some combination thereof, or the like may be configured to operate using DC power. The components and power utilized herein may, in exemplary embodiments without limitation, exclusively utilize direct current power such that no AC-DC or DC-AC inverters or the like are required.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may be personal computers, smartphones, tablets, databases, servers, or the like. The electronic connections described herein may be accomplished by wired or wireless means.

What is claimed is:

1. A solar powered vehicle topper unit ("VTU") comprising:
   an electronic display;
   a housing for said electronic display;
   a solar energy harvesting device electrically connected to said electronic display;
   an energy storage device electrically connected to said electronic display and said solar energy harvesting device; and
   a controller interposed between said energy storage device, said solar energy harvesting device, and said electronic display, wherein said controller comprises one or more processors and one or more electronic storage devices comprising executable software instructions, which when executed by said one or more processors, configures said one or more processors to:

determine a power requirement for operating the VTU;

determine direct current ("DC") power available from the solar energy harvesting device;

where the DC power available from the solar energy harvesting device meets or exceeds the power requirement, draw DC power solely from the solar energy harvesting device;

where the DC power solely from the solar energy harvesting device does not meet or exceed the power requirement;

determine DC power available from the energy storage device;

where a combination of the DC power available from the energy storage device and the DC power available from the solar energy harvesting device meets or exceeds the power requirement:

draw the DC power available from the solar energy harvesting device; and draw supplemental DC power from the energy storage device to at least meet the power requirement; and where the combination is less than the power requirement: adjust VTU operations to require less power.

2. The solar powered VTU of claim 1 wherein:
said energy storage device comprises a vehicle battery.

3. The solar powered VTU of claim 2 wherein:
said vehicle comprises at least one of an electric propulsion system and an internal combustion engine.

4. The solar powered VTU of claim 1 further comprising:
a mounting device, wherein said mounting device extends between said housing and a roof of the vehicle to elevate said housing from said roof of the vehicle when installed.

5. The solar powered VTU of claim 4 wherein:
said mounting device comprises a first crossbar spaced apart from a second crossbar.

6. The solar powered VTU of claim 1 wherein:
said solar energy harvesting device defines a maximum width dimension which is larger than a maximum width dimension for said housing; and
said solar energy harvesting device defines a maximum length dimension which is larger than a maximum length dimension for said housing.

7. The solar powered VTU of claim 1 wherein:
said solar energy harvesting device defines a minimum width dimension which is larger than a maximum width dimension for said housing; and
said solar energy harvesting device defines a minimum length dimension which is larger than a maximum length dimension for said housing.

8. The solar powered VTU of claim 1 wherein:
said solar energy harvesting device is configured to provide DC power; and
said electronic display is configured to directly accept and operate using DC power.

9. The solar powered VTU of claim 8 further comprising:
an open loop pathway for ambient air within said housing.

10. The solar powered VTU of claim 9 further comprising:
a closed loop pathway for circulating gas within said housing;
a heat exchanger located within said housing, wherein said open loop pathway comprises a first portion of said heat exchanger, and wherein said closed loop pathway comprises a second portion of said heat exchanger; and
a fan positioned within said closed loop pathway, wherein said fan is electrically connected to said solar energy harvesting device and is configured to operate using DC power.

11. The solar powered VTU of claim 1 wherein:
said one or more electronic storage devices of said controller comprise additional executable software instructions, which when executed by said one or more processors, configures said one or more processors to adjust VTU operations by driving a backlight for said electronic display at a reduced illumination level.

12. A method for providing solar power to a vehicle topper unit ("VTU"), said method comprising the steps of:
securing a solar panel at an elevated position above a housing comprising an electronic display;
mounting said housing to one or more crossbars mounted to a roof of a vehicle;
electrically connecting said solar panel to said electronic display;
electrically connecting said electronic display to a battery for said vehicle;
electrically interposing a controller between said battery and said electronic display;
operating said vehicle on public roadways;
determining a power requirement for operations of the VTU;
determining an amount of direct current ("DC") power available from the solar panel;
determining an amount of DC power available from the battery;
in at least one instance where the DC power available from the solar panel meets or exceeds the power requirement: powering the VTU with only the DC power available from said solar panel;
in at least one instance where the DC power available from the solar panel is less than the power requirement for operations of the VTU and a combination of the DC power available from the solar panel and the DC power available from the battery meets or exceeds the power requirement:
powering the VTU with the DC power available from the solar panel and supplementing the DC power from said solar panel with additional power from the battery to at least meet the power requirement for operations of the VTU; and
in at least one instance where the combination of the DC power available from the solar panel and the DC power available from the battery does not meet the power requirement, adjusting VTU operations to require less power.

13. The method of claim 12 further comprising the steps of:
electrically connecting a fan within said housing to said solar panel; and
operating said fan with the DC power supplied by said solar panel.

14. The method of claim 13 wherein:
the step of adjusting VTU operations to require less power comprises:
reducing a power level supplied to a backlight of the electronic display; and
reducing a speed of said fan.

15. A system for providing solar power to a vehicle topper unit ("VTU"), said system comprising:

a first crossbar mounted to a roof of a vehicle at a first location;

a second crossbar mounted to the roof of the vehicle at a second location spaced apart from the first location;

a housing having an upper surface, wherein a proximal portion of said housing is secured to said first crossbar and a distal portion of said housing is secured to said second crossbar;

a first electronic display located within said housing;

a second electronic display located within said housing in a back-to-back arrangement with said first electronic display;

an airflow pathway extending through said housing along said first and second electronic displays;

one or more fans located along said airflow pathway;

a solar energy harvesting device comprising a substrate and a plurality of photovoltaic cells arranged on said substrate, wherein said solar energy harvesting device is electrically connected to said first electronic display and said second electronic display, and wherein said solar energy harvesting device is configured to generate direct current ("DC") power when exposed to sufficiently sunny conditions;

a plurality of supports extending between said housing and said solar energy harvesting device such that said substrate is elevated directly above the upper surface of said housing;

a battery for said vehicle electrically connected to said first electronic display and said second electronic display, where said battery is configured to supply and receive DC power; and a controller interposed between said battery, said solar energy harvesting device, said first electronic display, said second electronic display, and each of said one or more fans, wherein said controller comprises one or more processors and one or more electronic storage devices comprising executable software instructions, which when executed by said one or more processors, configures said one or more processors to:

determine a power requirement for operations of at least first electronic display, the second electronic display, and each of the one or more fans;

if the power generated by the solar energy harvesting device meets or exceeds the power requirement, draw DC power solely from the solar energy harvesting device; and if the power generated by the solar energy harvesting device is below the power requirement, draw all available DC power solely from the solar energy harvesting device and supplement the drawn DC power with only as much additional DC power as needed to meet the determined power level from the battery;

wherein said solar energy harvesting device defines a minimum width which is larger than a maximum width of said housing;

wherein said solar energy harvesting device defines a minimum length which is larger than a maximum length of said housing;

wherein a footprint of said solar energy harvesting device completely overlies a footprint of said housing.

16. The solar powered VTU of claim 1 wherein:

said solar energy harvesting device has a first footprint, said housing has a second footprint, and said first footprint is larger than, and directly overlies, said second footprint.

17. The solar powered VTU of claim 1 further comprising:

a support extending between said housing and said solar energy harvesting device such that a bottom surface of said solar energy harvesting device is elevated directly above, and spaced apart from, a top surface of said housing.

18. The method of claim 12 further comprising:

said solar panel is positioned directly above, and spaced apart from, the housing when said solar panel is secured in said elevated position; and said solar panel defines a first footprint which is larger than, and completely overlies, a second footprint of said housing such that shade is periodically cast on said electronic display when said vehicle is operated on public roadways.

* * * * *